US010373812B2

(12) United States Patent
Paxton, IV et al.

(10) Patent No.: US 10,373,812 B2
(45) Date of Patent: Aug. 6, 2019

(54) ENHANCED THERMIONIC ENERGY CONVERTER AND METHOD OF USE

(71) Applicants: William F. Paxton, IV, Nashville, TN (US); Jim L. Davidson, Brentwood, TN (US); Weng P. Kang, Brentwood, TN (US); Mick E. Howell, Murfreesboro, TN (US)

(72) Inventors: William F. Paxton, IV, Nashville, TN (US); Jim L. Davidson, Brentwood, TN (US); Weng P. Kang, Brentwood, TN (US); Mick E. Howell, Murfreesboro, TN (US)

( * ) Notice: Subject to any disclaimer, the term of this patent is extended or adjusted under 35 U.S.C. 154(b) by 50 days.

(21) Appl. No.: 15/804,118

(22) Filed: Nov. 6, 2017

(65) Prior Publication Data
US 2018/0197724 A1    Jul. 12, 2018

Related U.S. Application Data

(63) Continuation-in-part of application No. 14/250,893, filed on Apr. 11, 2014, now abandoned.
(Continued)

(51) Int. Cl.
*H01J 45/00* (2006.01)
*C23C 16/27* (2006.01)
*C23C 16/511* (2006.01)

(52) U.S. Cl.
CPC ............ *H01J 45/00* (2013.01); *C23C 16/274* (2013.01); *C23C 16/278* (2013.01); *C23C 16/511* (2013.01)

(58) Field of Classification Search
CPC ............ H01J 45/00; H01J 19/68; H01L 35/00
(Continued)

(56) References Cited

U.S. PATENT DOCUMENTS 5,994,638 A    11/1999 Edelson
6,064,137 A    5/2000 Cox
(Continued)

OTHER PUBLICATIONS

Rasor, N.S., Thermionic Energy Converter, Fundamentals Handbook of Electrical and Computer Engineering, vol. II, S. S. L. Chang, Ed., New York: John Wiley & Sons Inc., 668-679, 1983.
(Continued)

*Primary Examiner* — Thanh Lam
(74) *Attorney, Agent, or Firm* — Carrithers Law Office, PLLC; David W. Carrithers (57) ABSTRACT

A thermionic energy converter includes an anode, a cathode spaced from the anode to define a gap therebetween and an operating environment of hydrogen wherein the anode and the cathode are disposed in the hydrogen operating environment so that molecular hydrogen is incorporated into the gap and the anode and the cathode are substantially exposed to the molecular hydrogen. Exposure of diamond samples to a hydrogen plasma reduces the resistance of the bulk diamond film. Hydrogen enhances electron transport through the bulk of the diamond and improves the thermionic emission current. Impregnation of a diamond electrode with hydrogen enhances bulk electron transport of the diamond due to hydrogen lying in the interstitial space between the carbon atoms. Hydrogen increases the bulk conductivity of diamonds films by interact with the diamond surface to form polarized C—H bonds reducing the electron affinity and in turn, reducing the work function. Exposure of diamond cathodes to a low energy hydrogen plasma drastically enhances thermionic emission current relative to as-grown diamond films by up to four orders of magnitude due to surface termination of diamond with hydrogen (i.e. hydrogenation of the diamond surface). Difficulty arises when attempting to utilize hydrogenated diamond electrodes for thermionic generators due to the hydrogen desorbing from
(Continued)

the diamond surface following a predictable time-dependent Arrhenius behavior. When hydrogenated diamond cathodes are heated to temperatures above 600° C., the desorption of the performance-enhancing hydrogen begin to decrease with increasing temperature. The present invention provides means for preventing desorption of hydrogen from hydrogenated diamond films at elevated temperatures to overcome the performance-limiting effect of the desorbtion of the hydrogen from the diamond surface by filling the gap between the cathode and anode with molecular hydrogen at a selected specific pressure in equilibrium. The thermionic generator is sealed and pressure remains constant or steady-state so that molecular hydrogen is introduced into the gap at a selected flow rate to replace any molecular hydrogen exiting the gap at the same flow rate whereby a selected pressure and volume of hydrogen is maintained in the gap throughout the process.

3 Claims, 8 Drawing Sheets

Related U.S. Application Data (60) Provisional application No. 61/810,915, filed on Apr. 11, 2013.

(58) Field of Classification Search
USPC .............................................. 310/306
See application file for complete search history.

(56) References Cited

U.S. PATENT DOCUMENTS

| | | | |
|---|---|---|---|
| 6,489,704 B1 | 12/2002 | Kucherov | |
| 6,946,596 B2 | 9/2005 | Kucherov | |
| 8,159,108 B2* | 4/2012 | Rasor | H01L 35/00 |
| | | | 136/206 |
| 8,258,672 B2* | 9/2012 | Walitzki | H01J 45/00 |
| | | | 310/306 |
| 8,970,088 B2* | 3/2015 | Kimura | H01J 45/00 |
| | | | 310/306 |
| 9,607,815 B2* | 3/2017 | Lee | H01J 45/00 |
| 2007/0126312 A1 | 6/2007 | Sung | |
| 2013/0169108 A1 | 7/2013 | Cheatham | |

OTHER PUBLICATIONS

Houston, J.M., Theoretical Efficiency of the Thermionic Energy Converter, AIP, vol. 30:4, Apr. 1959.
Ingold, J.H., Calculation of the Maximum Efficiency of the Thermionic Converter, Journal of Applied Physics, vol. 32:5, 769-772, May 1961.
Wilson, Volney C., Conversion of Heat to Electricity by Thermionic Emission, Journal of Applied Physics, vol. 30:4, 475-481, Apr. 1959.
Rasor, Ned S., Thermionic Energy Conversion Plasmas, IEEE Transactions on Plasma Science, vol. 19:6, 1191-1208, Dec. 1991.
Richardson, O.W., The Electrical Conductivity Imparted to a Vacuum by Hot Conductors, Philosophical Transactions of the Royal Society of London Series A, Containing Papers of a Mathematical or Physical Character, vol. 201, 497-549, 1903.
Nottingham, W.B., Thermionic Emission, Massachusetts Institute of Technology, Cambridge, Technical Report 321, Dec. 10, 1956.
Himpsel, F.J. et al, Quanium photoyield of damond(111)—A stable negative-affinity emitter, Physical Review B, vol. 20:2, 624-627, Jul. 15, 1979.
Cui, J. B. et al., Hydrogen:termination and electron emission from CVD diamond surfaces: a combined secondary electron emission, photoelectron emission microscopy, photoelectron yield, and field emission study, Diamond and Related Materials, vol. 9, 1143-1147, 2000.
Albin, Sacharia et al., Current-Voltage Characteristics of Thin Film and Bulk Diamond Treated in Hydrogen Plasma, IEEE Electron Device Letters, vol. 11:4, 159-161, Apr. 1990.
Krainsky, I. L. et al., Negative-electron-affinity effect on the surface of chemical-vapor-deposited diamond polycrystalline films, Physical Review B, vol. 53:12, R7650-R7653, Mar. 1996.
Paxton, W. F. et al., Influence of hydrogen on the thermionic electron emission from nitrogen-incorporated polycrystalline diamond films, Journal of Vacuum Science & Technology B: Microelectronics and Nanometer Structures, vol. 30:2, 021202-1-021202-3, 2012.
Kataoka, Mitsuhiro et al., Thermionic electron emission from nitrogen-doped homoepitaxial diamond, Diamond and Related Materials, vol. 19,110-113, 2010.
Suzuki, Mariko et al., Low-temperature thermionic emission from nitrogen-doped nanocrystalline diamond films on n-type Si grown by MPCVD, Diamond and Related Materials, vol. 18, 1274-1277, 2009.
Paxton, W. F. et al., The effect of hydrogen desorption kinetics on thermionic emission from polycrystalline chemical vapor deposited diamond, Applied Physics Letters, vol. 101, 243509-1-243509-5, 2012.
Rasor, N. S., Emission Physics of the Thermionic Energy Converter, Proceedings of the IEEE, vol. 51, 733-747, 1963.
Hernqvist, K. G., Analysis of the Arc Mode Operation of the Cesium Vapor Thermionic Energy Converter, Proceedings of the IEEE, vol. 51, 748-754, 1963.
Witting, Harold L. et al., An Ionization Process in a Low-Energy Cesium Plasma, Journal of Applied Physics, vol. 36:4, 1328-1337, 1965.
Hatsopoulos, George N., Transport Effects in Cesium Thermionic Converters, Proceedings of the IEEE, vol. 51, 725-733, 1963.
Langmuir, Irving et al.; Thermionic Effects Caused by Alkali Vapors in Vacuum Tubes, Science, vol. 57:1463, 58-60, Jan. 12, 1923.
Fitzpatrick, Gary O. et al., Updated Perspective on the Potential for Thermionic Conversion to Meet 21st Centuryienergy Needs, Energy Conversion Engineering Conference (IECEC-97), Proceedings of the 32nd Intersociety, vol. 2, 1045-1051, 1997.
Maier, F. et al., Electron Affinity of plasma-hydrogenated and chemically oxidized diamond (100) surfaces, Physical Review B, vol. 64, 165411L1-165411-7, 2001.
Koeck, F. A. M. et al., Enhanced thermionic energy conversion and thermionic emission from doped diamond films through methane exposure, Diamond and Related Materials, vol. 20, 1229-1233, 2011.
Heber, O. et al., Lifetime's of the negative molecular hydrogen ions: H2-, D2-, and Hd-, Physical Review A, vol. 73, 060501-1-060501-4, 2006.
Schwarzschild, Bertram M., Negative ions of molecular hydrogen, Physics Today, vol. 64, p. 23, 2011.
Eyring, Henry et al., The Theoretical Treatment of Chemical Reactions Produced by Ionization Processes Part I. The Ortho-Para Hydrogen Conversion by Alpha-Particles, The Journal of Chemical Physics, vol. 4, 479-491, 1936.
Moiseiwitsch, B. L., Electron Affinities of Atoms and Molecules, Advances in Atomic and Molecular Physics, vol. 1, D. R. Bates and I. Estermann, Eds., New York: Academic Press, 61-83, 1965.
Fischer-Hjalmars, Inga, Theoretical Investigation of the Negative Hydrogen Molecule Ion, The Journal of Chemical Physics, vol. 30 p. 1099, 1959.
Harcourt, Richard D., A bound 2 Σ g + ground state for H2-? A valence-bond study, Journal of Physics B: Atomic and Molecular Physics, vol. 20, L617-L621, 1987.
Dalgarno, A. et al., Charge Transfer and the Mobility of H-Ions in Atomic Hydrogen, Proceedings of the Physical Society, Section A, vol. 691, 615-623, 1956.
Jordon-Thaden, B. et al., Structure and Stability of the Negative Hydrogen Molecular Ion, Physical Review Letters, vol. 107, 193003-1-193003-4, Nov. 2011.

(56) References Cited

OTHER PUBLICATIONS

Khvostenko, V. I. et al., Formation of negative H-ions in electron collisions with hydrogen molecules, Zhurnal Eksperimental'noi i Teorelifcheskoi Fiziki, vol. 33:4, 657-660, 1957.
Golser, R. et al., Experimental and Theoretical Evidence for Long-Lived Molecular Hydrogen Anions $H_2-$ and $D_2-$, Physical Review Letters, vol. 94, 223003-1-223003-4, Jun. 2005.
Shiryaev, A. A. et al., On the interaction of molecular hydrogen with diamonds: An experimental study using nuclear probes and thermal desorption, Diamond and Related Materials, vol. 16, 1479-1485, 2007.
Melnik, M. S., Diamond Surfaces: Interactions with Hydrogen and Halogens, Doctor of Philosophy Thesis, Applied Physics, California Institute of Technology, Pasadena, CA, 1-65, May 1997.
Roberts, Ralph, Energy Sources and Conversion Techniques: What is our capability of meeting the energy needs of the future within the limitations of known energy resources and energy conversion technology, American Scientist, vol. 61, 66-75, 1973.

* cited by examiner

ENHANCED THERMIONIC ENERGY CONVERTER AND METHOD OF USE

CROSS-REFERENCE TO RELATED PATENT APPLICATION

This is a continuation-in-part application claiming priority from U.S. application Ser. No. 14/250,893 filed on Apr. 11, 2014 which claims priority to U.S. Provisional Patent Application Ser. No. 61/810,915, filed Apr. 11, 2013, both of which are incorporated by reference herein in its entirety.

STATEMENT AS TO RIGHTS UNDER FEDERALLY-SPONSORED RESEARCH

The invention was made with government support under Grand No. NSF EPS 1004083 awarded by the National Science Foundation. The government has released all rights to inventors/assignees.

FIELD OF INVENTION

The present invention is related to thermionic energy conversion devices, or thermionic generators. In particular, the present invention represents a novel means of utilizing hydrogen environments to improve the performance of diamond-based thermionic energy conversion devices by enabling higher operating temperatures.

BACKGROUND OF THE INVENTION

Thermionic Generators

Thermionic energy conversion (TEC) is a technique that allows for the efficient conversion of thermal energy directly into electrical energy. Thermionic energy conversion is the direct production of electric power from heat by thermionic electron emission. Essentially it is the use of electron vapor as the working fluid in a power-producing cycle. A thermionic converter consists of a hot emitter electrode from which electrons are vaporized by thermionic emission and a colder collector electrode into which they are condensed after conduction through the inter-electrode plasma. The resulting current, typically several amperes per square centimeter of emitter surface, delivers electrical power to a load at a typical potential difference measured in volts. The thermal efficiency depends on the emitter temperature and mode of operation.

TEC is based on the physical principal of thermionic emission which describes the thermal emission of electrons from a heated cathode. As a cathode is heated above zero Kelvin, it can be predicted, based on Fermi-Dirac statistics that some of the cathode's electrons will have energies equal to or greater than the cathode's work function. The work function is the energy required for an electron to be emitted into the vacuum. The function of the cathode in such a heat engine is to act as an "electron boiler", while the anode functions as the electron condenser. These two components result in electric pressure (i.e., voltage), difference which produces work. The difference between the heat of vaporization of the electrons from the emitter and the heat of condensation of the electrons into the collector directly equals the amount of electrical work produced per electron.

Thermionic generators are devices that can directly convert thermal energy to electrical energy. The most basic configuration of a thermionic generator consists of three primary components: a cathode, an anode, and the necessary electrical connections between the two. The cathode and anode are separated by either a vacuum or a certain gaseous environment. As thermal energy is imparted to the cathode, electrons with sufficient energy will be ejected by a process known as thermionic emission and will traverse the inter-electrode gap to be collected at the anode. The electrons then drive an electrical load as they are cycled back to the cathode through the electrical connections.

The performance of a thermionic energy converter, ("TEC"), device is highly influenced by the cathode's ability to emit electrons when heated. This thermionic emission process is follows a relation known as the Richardson equation, defined as:

$$J = AT^2 e^{-\varphi/kT}$$

where J is the thermionic emission current density in Amps per square centimeter; A is the cathode's Richardson constant in units of Amps per square centimeter per kelvin; T is the cathode temperature in Kelvin; $\varphi$ is the cathode work function in electron volts; and K is the Boltzmann Constant in electron volts per Kelvin. It thus follows from the Richardson equation that the emission current is exponentially dependent on the samples work function which is defined as the energy barrier that electrons must overcome in order to be emitted from a cathode. Thus, materials with lower work functions can emit more electrons at the same temperature as materials with higher work functions assuming identical pre-exponential Richardson constants.

Thermionic emission has been long understood, however, previous efforts to develop suitable electrodes for TEC have been met with only limited success. Some of the first patents describing this energy conversion approach were filed in the 1950's by W. Caldwll (U.S. Pat. No. 2,759,112) and G. Hatsopoulos (U.S. Pat. No. 2,915,652). Both NASA and the Soviet Space Program spent decades of research and billions of dollars in an effort to develop a high-performing TEC device for long duration space flight missions. Some approaches achieved useful DC output currents of ~20 A/cm$^2$ at an output voltage between 0.5V to 1.5V and operated continuously for 5 or more years. However, these devices had low operational efficiencies (~20%) and required excessively high operation temperatures (>2000° C.) due to material limitations with work functions in the 4-5 eV range. Effective work functions can be lowered by modifying the surface with cesium; however, the adsorbate techniques typically do not hold up to high fields or long operation times. Thermal sources required for the very high operation temperatures of conventional TEC devices limit the technology.

Examples of conventional thermionic emitters consisted of tungsten, tantalum, and rhenium. The effective work function can be lowered by using thin films of thorium or cesium on the emitter surface, however, these material required co is instant replenishment to prevent depletion due to evaporation. Low work function oxides such as BaO (0.99 eV), SrO (1.27 eV) and CaO (1.77 eV) when deposited as thin films on emitters can yield enhanced thermionic emission but are limited to pulsed or low power applications to prolong their life.

Conventional implementations of thermionic energy converters utilize tungsten cathodes with cesium gas fed into the cathode-anode gap. Tungsten has a relatively high work function requiring high temperatures (in excess of 2000° C.) in order to achieve practical thermionic current densities. The work function can be lowered by "cesiating" the tungsten surface. The effects of the cesium rapidly diminish during operation as the tungsten out gases when heated to operating temperatures. By incorporating cesium gas into the inter-electrode gap, the cesium in the tungsten could be constantly replenished allowing for stable operation. In addition to enhancing the surface chemistry, operation of tungsten cathodes in a cesium vapor environment (rather than a vacuum) has been shown to favorable affect the electron transport from the cathode to the anode.

The high emission currents required to produce necessary output power levels often result in space charge effects. Space charge effects are due to the negatively charged electrons traversing the cathode-anode gap which cancel out a portion of the electric field between the cathode and anode. More electrons present in the gap equates to more of the electric field being canceled, further suppressing the emission current.

This performance limiting effect can be mitigated (or even eliminated) through the presence of positive cesium ions in the cathode-anode gap. One method to introduce these ions is through surface ionization. When a tungsten cathode is heated to temperatures in excess of 1200° C., the cesium atoms that strike it are ionized resulting in positively charged cesium ions. The positive charges present adjacent to the emitter surface cancel out the negative charges of the electrons, reducing the space charge effect. Cesium ions can also be produced by collision of cesium atoms with the thermionically emitted electrons from the cathode. In order for ionization to occur, electron temperatures greater than 2500° C. are required.

In addition, diamond thermionic cathodes in a high pressure (up to 700 mTorr) methane environment greatly increases the emission performance compared to operation in a vacuum environment. However, methane is not a suitable candidate for increasing the performance of a diamond TEC, since operation in methane will result in the accumulation of non-diamond carbonaceous content, akin to soot, preventing the long term operation of such a configuration.

Diamond Thermionic Converters

More recent attempts to capitalize on the potentially high efficiencies of thermionic converters have focused on utilizing diamond electrodes. Diamond has demonstrated exceptionally low work functions, well below 2 eV. Recent patents pertaining to the use of diamond in thermionic generators include I. W. Cox (U.S. Pat. No. 5,981,071), R. J. Nemanich and F. Koeck (U.S. Pat. No. 8,188,456), and C. M. Sung (U.S. 2007/0126312 A1), among others. While employing substitute dopants such as nitrogen, phosphorus, boron, etc. is one technique frequently discussed in the above mentioned patents as a means to improve the performance of diamond films.

Hydrogen places a crucial role in both enhancing electron transport through the bulk of the diamond and also improving the thermionic emission current by lowering the work function.

Cox (U.S. Pat. No. 6,214,651 B1) and Sung (US Patent Publication 2007/0126312 A1) both of which are incorporated by reference herein, teach utilizing hydrogen as a "dopant" in diamond intentionally introducing impurities into an extremely pure semiconductor to change its electrical properties. The use of the term "dopant" implies that hydrogen can be substituted for a carbon atom in the diamond lattice; however, due to hydrogen's single valence electron available for bonding, the term doping likely describes a diamond electrode impregnated with hydrogen, whereby hydrogen lies in the interstitial space between the carbon atoms which is believed to enhance bulk electron transport within diamond which agrees with experimental data indicating exposure of diamond samples to a hydrogen plasma reduces the resistance of the bulk diamond film.

In addition to increasing the bulk conductivity of diamond films, hydrogen has been shown to interact with the diamond surface to form polarized C—H bonds, reducing the electron affinity and in turn, reducing the work function. Exposure of diamond cathodes to a low energy hydrogen plasma prior to testing is known to drastically enhance thermionic emission current relative to as-grown diamond films by four orders of magnitude. Multiple patents teach the surface termination of diamond with hydrogen (i.e. hydrogenation of the diamond surface) such as those by Nemanich et al. (U.S. Pat. No. 8,188,456 B2), Kataoka et al. (US 2015/0075579 A1 and US 2011/0017,253 A1) and Cox (U.S. Pat. No. 6,214,651 B1) and Sung (US 2007/0126312 A1) all of which are incorporated by reference herein.

Hydrogen has consistently been shown to enhance the thermionic emission of diamond films.

Difficulty arises when attempting to utilize hydrogenated diamond electrodes for thermionic generators due to the desorption of hydrogen from the diamond films at elevated temperatures.

Recent studies have shown that hydrogen desorbs from the diamond surface following a predictable time-dependent Arrhenius behavior. When hydrogenated diamond cathodes are heated to temperatures above 600° C., this desorption of the performance-enhancing hydrogen becomes so pronounce that the emission current will strongly deviate from the Richardson equation above and begin to decrease with increasing temperature rather than the predicted increase.

The present invention entails a means to overcome the performance-limiting effect of the desorbtion of the hydrogen from the diamond surface at elevated temperatures of 600° C. or greater.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements.

SUMMARY OF THE INVENTION

Hydrogen places a crucial role in both enhancing electron transport through the bulk of the diamond and also improving the thermionic emission current by lowering the work function. Exposure of diamond samples to a hydrogen plasma reduces the resistance of the bulk diamond film. Hydrogen increases the bulk conductivity of diamonds films by interact with the diamond surface to form polarized C—H bonds, reducing the electron affinity and in turn, reducing the work function. Impregnation of a diamond electrode with hydrogen enhances bulk electron transport of the diamond due to hydrogen lying in the interstitial space between the carbon atoms. Exposure of diamond cathodes to a low energy hydrogen plasma drastically enhances thermionic emission current relative to as-grown diamond films by up to four orders of magnitude due to surface termination of diamond with hydrogen (i.e. hydrogenation of the diamond surface).

Difficulty arises when attempting to utilize hydrogenated diamond electrodes for thermionic generators due to the hydrogen desorbing from the diamond surface following a predictable time-dependent Arrhenius behavior. When hydrogenated diamond cathodes are heated to temperatures above 600° C., this desorption of the performance-enhancing hydrogen becomes so pronounce that the emission current will strongly deviate from the Richardson equation above and begin to decrease with increasing temperature rather than the predicted increase.

The present invention provides means for preventing desorption of hydrogen from hydrogenated diamond films at elevated temperatures to overcome the performance-limiting effect of the desorbtion of the hydrogen from the diamond surface.

In view of the foregoing problems associated with the performance degradation of diamond thermionic electrodes due to hydrogen desorption, it is the object of the present invention to provide an operating environment conducive to mitigating this effect.

The present invention may be used to improve the performance of diamond electrodes during, beyond any treatment performed on a thermionic generator electrode prior to assembly or implementation into a thermionic generator such as hydrogen plasma exposure.

A thermionic converter includes an emitter electrode, a collector electrode and a spacing in between. The emitter electrode is composed of diamond, carbon with some level of SP3 bonding, or any material which hydrogen surface termination or interstitial hydrogen atoms can improve the emission current performance. The collector electrode is comprised of any material for collecting electrons emitted from the collector including diamond, carbon with some level of SP3 bonding, or any material which hydrogen surface termination or interstitial hydrogen can improve its ability to collect electrons. The gap between the emitter and collector is filled with molecular hydrogen at some specific pressure in equilibrium such that the thermionic generator is sealed and pressure remains constant or steady-state such that molecular hydrogen is introduced into the gap at some flow rate and molecular hydrogen exits the gap at the same flow rate whereby a desired pressure is maintained. This molecular hydrogen is independent of heat source or external atmospheric conditions.

The molecular hydrogen in this thermionic converter can interact with the emitted electrons from the emitter, some catalyst, the diamond surface, or any combination (but not limited to) all three to modify its molecular, chemical, thermal, and/or electronic states prior to interaction with the emitter and/or collector. The hydrogen present in the gap in its standard molecular ground state and/or any other state after interactions with any component or energy source associated with the thermionic converter, including hydrogen's dissociated atomic state, will then interact with the emitter and/or collector to replenished hydrogen desorbed from the emitter and/or collector. Such hydrogen existing in any molecular, chemical, thermal, and/or electronic state can also interact with the emitter and/or collector to improve the thermionic emission and/or electron collection performance of the emitter and/or collector through, but not limited to, surface termination of the emitter and/or collector surface and incorporation within the emitter and/or collector. Such surface termination or incorporation within cathode and/or anode of hydrogen in any state can be used in addition to and/or in place of any treatment performed prior to assembly of the thermionic generator.

It is contemplated that the cathode and/or anode may comprises or consist of diamond particles or diamond nano particles disposed in a metal matrix providing a layer of diamond particles on a surface of the cathode and/or anode, wherein the metal matrix is selected from the group consisting of aluminum, cadmium, chromium, cobalt, copper, gold, iron, lead, manganese, magnesium, molybdenum, nickel, niobium, palladium, platinum, rhodium, silver, steel, stainless steel, tantalum, tin, titanium, tungsten, vanadium, inc, and combinations thereof.

The present thermal energy conversion device comprises or consists of an anode selected from the group consisting of a nitrogen-incorporated diamond film, a diamond film, a diamond, and combinations thereof; a cathode for electron emission spaced apart a selected distance from the anode to define a gap therebetween, wherein the cathode is selected from the group consisting of a nitrogen-incorporated diamond film, a diamond film, a diamond, and combinations thereof; a gaseous species such as a hydrogen applied to the cathode and into the gap between the cathode and anode forming H bonds and/or C—H bonds on the surface of the cathode; and means for heating the cathode at a desired temperature; means for providing a predetermined pressure; whereby electrons emitted from the cathode and traversing towards the anode are of a function of temperature at the cathode. Means for introducing and releasing a selected quantity of the gaseous species can be used to maintain a constant predetermined pressure is incorporated herewith. The gaseous species, for instance molecular hydrogen, is continuously introduced into the gap during operation at a selected rate and the H bonds and/or C—H bonds on the surface of the cathode are constantly renewed and continually formed at the gap and exits the gap at a selected constant rate. The thermionic generator or at least the portion including the cathode and anode may be enclosed in a gas sealed container such as a microwave plasma-enhanced chemical vapor deposition (MPCVD) reactor in order to control the pressure and flow rate of the gaseous species in fluid communication with the cathode and anode and gap therebetween.

A method of producing energy in a thermal energy conversion device comprising or consisting of an anode selected from the group consisting of a nitrogen-incorporated diamond film, a diamond film, a diamond, and combinations thereof; a cathode for electron emission spaced apart a selected distance from the anode to define a gap therebetween, wherein the cathode is selected from the group consisting of a nitrogen-incorporated diamond film, a diamond film, a diamond, and combinations thereof; and a gaseous species such as a hydrogen, comprising the steps of:

applying a gaseous species to the cathode and into the gap between the cathode and anode forming H bonds and/or C—H bonds on the surface of the cathode; heating the cathode at a desired temperature; pressurizing a selected quantity of the gaseous species to a predetermined pressure; controlling the temperature of the cathode to emit electrons traversing towards the anode; replenishing the gaseous species used during the conversion process to maintain the predetermined pressure of the gaseous species at the cathode.

The present thermal energy conversion device comprises or consists of an anode selected from the group consisting of a nitrogen-incorporated diamond film, a diamond film, a diamond, a carbon, a material having a surface terminated with hydrogen, and combinations thereof; a cathode for electron emission spaced apart a selected distance from the anode to define a gap therebetween, wherein the cathode is selected from the group consisting of a nitrogen-incorporated diamond film, a diamond film, a diamond, a material having a surface terminated with hydrogen, and combinations thereof; a gaseous species such as a hydrogen, a molecular hydrogen, applied to the cathode and into the gap between the cathode and anode forming H bonds and/or C—H bonds on the surface of the cathode; and means for heating the cathode at a desired temperature; means for providing a predetermined pressure; whereby electrons emitted from the cathode and traversing towards the anode are of a function of temperature at the cathode.

It is an objective for the present invention to provide a device wherein at least the anode and/or the cathode can comprise a material containing hydrogen.

It is an objective for the present invention to provide a device which can include a plurality of cathodes and/or a plurality of anodes.

It is an objective for the present invention to provide a method of producing energy in a thermal energy conversion device comprising an anode a nitrogen-incorporated diamond film, a diamond film, a diamond, a carbon, a material having a surface terminated with hydrogen, and combinations thereof, and a cathode for electron emission spaced apart a selected distance from the anode to define a gap therebetween, wherein the cathode is selected from the group consisting of a nitrogen-incorporated diamond film, a diamond film, a diamond, a material having a surface terminated with hydrogen, and combinations thereof; exposing the cathode to a gaseous species selected from the group consisting of hydrogen, a molecular hydrogen, into the gap forming H bonds and/or C—H bonds on the surface of the cathode; and heating the cathode at a desired temperature and at a predetermined pressure, whereby electrons emitted from the cathode and traversing towards the anode are of a function of temperature at the cathode.

It is an objective for the present invention to provide a method wherein a gaseous species can be introduced into a thermionic generator prior to operation and the entire thermionic generator is sealed to prevent the molecular hydrogen from exiting the gap.

It is an objective for the present invention to provide a method wherein a gaseous species can form a hydrogen terminated surface for at least one of the cathode or the anode or both.

It is an objective for the present invention to provide a method wherein a gaseous species can form H bonds and/or C—H bonds on the surface for at least one of the cathode or the anode or both.

It is an objective for the present invention to provide a method wherein a gaseous hydrogen can react to form a hydrogen terminated surface for at least one of the cathode or the anode.

It is an objective for the present invention to provide a thermionic generator, comprising or consisting of an anode; a cathode spaced from the anode to define a gap therebetween; a gap comprised of a of molecular hydrogen at a fixed pressure, whereby the molecular hydrogen is continuously introduced into the gap during operation at a certain rate and molecular hydrogen exits the gap at the same rate; and a sealing mechanism to contain molecular hydrogen.

It is an objective for the present invention to provide a thermionic generator, comprising or consisting of an anode; a cathode spaced from the anode to define a gap therebetween; a gap comprised of a of gaseous species at a fixed pressure, whereby the gaseous species is continuously introduced into the gap during operation at a certain rate and gaseous species exits the gap at the same rate; and a sealing mechanism to contain molecular hydrogen.

It is an objective for the present invention to provide a thermionic generator, comprising or consisting of an anode; a cathode spaced from the anode to define a gap therebetween; a gap comprised of a of gaseous species at a fixed pressure, whereby the gaseous species is continuously introduced into the gap during operation at a certain rate and molecular hydrogen is continually formed at the gap and exits the gap at a selected constant rate.

It is an objective for the present invention to provide a thermionic generator, comprising or consisting of an anode; a cathode spaced from the anode to define a gap therebetween; a gap comprised of a of gaseous species at a fixed pressure, whereby the gaseous species forms H bonds and/or C—H bonds on the surface of the cathode and the gaseous species is continuously introduced into the gap during operation at a selected rate and the H bonds and/or C—H bonds on the surface of the cathode are constantly renewed and continually formed at the gap and exits the gap at a selected constant rate.

It is an objective for the present invention to provide a thermionic generator, comprising or consisting of an anode; a cathode spaced from the anode to define a gap therebetween; and a gap comprised of a fixed amount of molecular hydrogen, whereby the molecular hydrogen is introduced prior to operation and the entire thermionic generator is sealed to prevent said molecular hydrogen from exiting the gap.

In summary, a thermionic energy converter includes an anode, a cathode spaced from the anode to define a gap therebetween and an operating environment of hydrogen wherein the anode and the cathode are disposed in the hydrogen operating environment so that molecular hydrogen is incorporated into the gap and the anode and the cathode are substantially exposed to the molecular hydrogen. Exposure of diamond samples to a hydrogen plasma reduces the resistance of the bulk diamond film. Hydrogen enhances electron transport through the bulk of the diamond and improves the thermionic emission current. Impregnation of a diamond electrode with hydrogen enhances bulk electron transport of the diamond due to hydrogen lying in the interstitial space between the carbon atoms. Hydrogen increases the bulk conductivity of diamonds films by interact with the diamond surface to form polarized C—H bonds reducing the electron affinity and in turn, reducing the work function. Exposure of diamond cathodes to a low energy hydrogen plasma drastically enhances thermionic emission current relative to as-grown diamond films by up to four orders of magnitude due to surface termination of diamond with hydrogen (i.e. hydrogenation of the diamond surface). Difficulty arises when attempting to utilize hydrogenated diamond electrodes for thermionic generators due to the hydrogen desorbing from the diamond surface following a predictable time-dependent Arrhenius behavior. When hydrogenated diamond cathodes are heated to temperatures above 600° C., the desorption of the performance-enhancing hydrogen begin to decrease with increasing temperature. The present invention provides means for preventing desorption of hydrogen from hydrogenated diamond films at elevated temperatures to overcome the performance-limiting effect of the desorbtion of the hydrogen from the diamond surface by filling the gap between the cathode and anode with molecular hydrogen at a selected specific pressure in equilibrium. The thermionic generator is sealed and pressure remains constant or steady-state so that molecular hydrogen is introduced into the gap at a selected flow rate to replace any molecular hydrogen exiting the gap at the same flow rate whereby a selected pressure and volume of hydrogen is maintained in the gap throughout the process.

More particularly, the thermal energy conversion device comprises or consists of a microwave plasma-enhanced chemical vapor deposition reactor; means for producing a selected kW microwave power; the reactor including at least one anode selected from the group consisting of a nitrogen-incorporated diamond film, a diamond film, a diamond, a polycrystalline nitrogen-incorporated diamond, and combinations thereof deposited on a selected substrate. The the reactor including at least one cathode for electron emission spaced apart a selected distance from the anode to define a gap therebetween. The cathode is selected from the group consisting of a nitrogen-incorporated diamond film, a diamond film, a diamond, a polycrystalline nitrogen-incorporated diamond, and combinations thereof deposited on a selected substrate. A gaseous species comprising at least molecular hydrogen is included together with means for heating the cathode in the reactor at a desired temperature, means for providing a selected pressure within the reactor, means for monitoring the selected pressure within the reactor, and means for introducing and releasing a selected quantity of the gaseous species to maintain a constant predetermined pressure within the reactor.

A method of producing energy in a thermal energy conversion device comprises or consists of the steps of selecting an anode from the group consisting of a nitrogen-incorporated diamond film, a diamond film, a diamond, a polycrystalline nitrogen-incorporated diamond, and combinations thereof deposited on a selected substrate; and selecting a cathode from the group consisting of a nitrogen-incorporated diamond film, a diamond film, a diamond, a polycrystalline nitrogen-incorporated diamond, and combinations thereof deposited on a selected substrate. A gaseous species comprising molecular hydrogen is selected and the anode is positioned at a selected distance from the cathode forming a gap therebetween. The cathode is heated at a desired temperature and a gaseous species is applied to the cathode and into the gap between the cathode and anode forming H bonds and/or C—H bonds on the surface of the cathode. A selected quantity of the gaseous species is pressurized to a predetermined pressure and the cathode is heated to a controlled temperature emitting electrons which traverse towards the anode producing an thermionic emission current. An electric field is applied to an anode to collect an emission of thermionically emitted electrons from the heated cathode. The gaseous species used up by conversion during the process is replenished during the conversion process maintaining the predetermined pressure of the gaseous species at the cathode and the gap.

Other objects, features, and advantages of the invention will be apparent with the following detailed description taken in conjunction with the accompanying drawings showing a preferred embodiment of the invention.

DETAILED DESCRIPTION OF THE INVENTION

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or any of the exemplified term. Likewise, the invention is not limited to various embodiments given in this specification.

It will be understood that when an element is referred to as being "on" another element, it can be directly on the other element or intervening elements and may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" when used in this specification, specify the presence of stated features, regions, integers steps, operations, elements, and/or components, but do not preclude the presence or addition of one or more other features, regions, integers, steps, operations, elements, components, and/or groups thereof.

Furthermore, relative terms such as "lower" or "bottom" and "upper" or "top", may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower" can therefore, encompass both orientation of "lower" and "upper" depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when an element is referred to as being "on", "attached" to, "connected" to, "coupled" with, "contacting", etc., another element, it can be directly on, attached to, connected to, coupled with or contacting the other element or intervening elements may also be present. In contract, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

As used herein, "around", "about", "substantially" or "approximately" shall generally mean within 20 percent, preferably within 10 percent, and more preferably within 5 percent of a given value or range. Numerical quantities given herein are approximate, meaning that the term "around", "about", "substantially" or "approximately" can be inferred if not expressly stated.

The description will be made as to the embodiments of the invention in conjunction with the accompanying drawings. In accordance with the purpose of this invention, as embodied and broadly described herein, this invention, in one aspect, relates to an enhanced thermionic energy converter and applications of the same.

In certain embodiments, a thermionic generator, also referenced as a thermionic converter and thermionic energy converter herein, has a cathode, also referenced as emitter herein, an anode, also referenced as a collector herein, whereby the emitter and or collector is exposed to molecular hydrogen.

Figure 1:
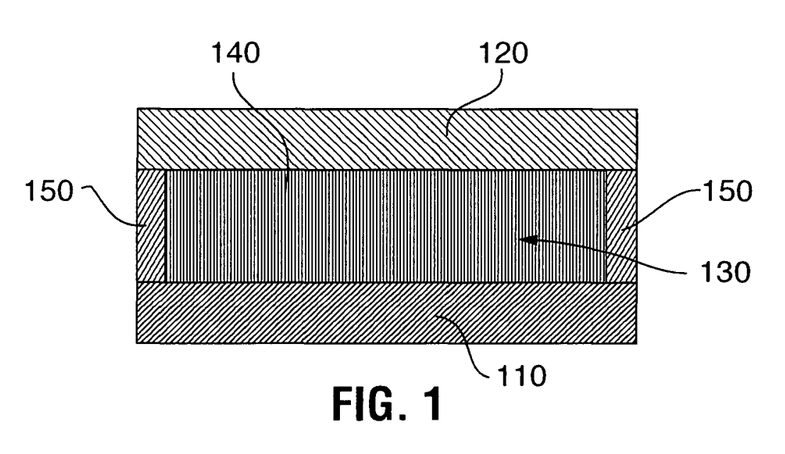
FIG. 1 shows schematically a basic thermionic converter according to the embodiment of the invention.

Referring to FIG. 1, a thermionic generator 100 is shown according to one embodiment of the invention. Generally, the thermionic generator 100 comprises or consists of an anode 110, a cathode 120 spaced from the anode 110 to define a gap 130 therebetween, and molecular hydrogen 140 incorporated into the gap 130. In certain embodiments, the molecular hydrogen incorporated into the gap 130 is operably at a predetermined pressure. The molecular hydrogen 140 incorporated into the gap 130 is maintained at a fixed pressure by introducing the molecular hydrogen 140 prior to operation and the gap 130 is completely sealed by the cathode 120, anode 110, some form of spacer 150 separating the cathode 120 and anode 110, and/or any other components such that the molecular hydrogen 140 is unable to exit the gap 130. The molecular hydrogen 140 incorporated into the gap 130 is maintained at a fixed pressure by introducing the molecular hydrogen 140 into the gap 130 during operation at a certain flow rate and providing a means for molecular hydrogen 140 to exit the gap 130 at the same flow rate for which it is entered. The molecular hydrogen 140 incorporated into the gap 130 is supplied by some external hydrogen source, independent of thermal energy source. Both the anode 110 and cathode 120 can be formed of a selected substrate such as a diamond or matrix containing diamonds including nano diamonds and/or nano diamond particles. Either one or both the anode 110 and the cathode 120 can comprises a diamond, diamond film on a substrate, or diamond impregnated matrix. Moreover, the anode 110 and/or the cathode 120 or both can comprise or consist of a material with hydrogen bonded to the surface facing towards the gap 130. The anode 110 and/or the cathode 120 or both may comprise or consist of a material with molecular and or atomic hydrogen within the material itself, either bonded or present in interstitial sites. In certain embodiments, both the anode 110 and the cathode 120 may be formed of non-diamond materials. The thermionic generator or at least the portion including the cathode and anode may be enclosed in a gas sealed container in order to control the pressure and flow rate of the gaseous species in fluid communication with the cathode and anode and gap therebetween.

In one preferred embodiment, each of the anode 110 and the cathode 120 are formed as films on a selected substrate, and the anode 110 and the cathode 120 are parallel to each other. It should be noted that other types of the anode and cathode can also be utilized in practice of the invention. Such other types of anode 110 and cathode 120 configurations can include but are not limited to as single material, such that the same material the emits or collects electrons is directly in contact with the electrical connections or a multilayer electrode comprising a substrate and multiple film layers between the substrate and the emission and or collection surface. It should also be noted that additional electrode can also be used in addition to the anode 110 and cathode 120 that may or may not have some interaction with the hydrogen present in the gap.

In operation, as thermal energy is imparted to the cathode 120, electrons with sufficient energy thermionically emit from the surface of the cathode 120 and traverse the gap 130 towards the anode 110 where they are collected. The electrons emitted from the cathode 120 and traversing towards the anode 110 are a function of the temperature of the cathode 120. The emitted electrons can be utilized to drive a load as they are cycled back to the cathode 120 through the electrical connections.

According to the invention, the molecular hydrogen 140 incorporated into the gap 130 plays an important role in preventing the desorption of hydrogen from the cathode 120 and/or anode 110; replenishing the desorbed hydrogen 650 from the cathode 120 and/or anode 110 during operation with new hydrogen on the surface sites 660 and incorporating hydrogen within the bulk 670 of the cathode 120 and/or anode 110; enhancing the emission from the cathode 120; and/or enhancing the collection ability of the anode 110. The molecular hydrogen 140 may interact with but not limited to electrons emitted from the cathode 120 traversing the gap 130; the cathode 120 and/or anode 110 surface; thermal energy supplied to the cathode 120; and/or a catalyst prior to enhancing the performance of the diamond surface.

Hydrogen has been shown to greatly enhance the electrical properties of diamond. Hydrogen present in the bulk of diamond has been shown to increase its conductivity. Hydrogen interaction with the diamond surface can create polarized C—H surface bonds 610 which lower diamond's electron affinity, directly correlating to lower work function and increased thermionic emission current at temperature compared to a sample with no C—H surface bonds. Both of these factors are favorable for thermionic emission.

In another aspect of the invention, a thermionic generator comprises a cathode; an anode positioned some distance from the cathode to create a gap therebetween; and molecular hydrogen. In one embodiment, the molecular hydrogen is in contact with the cathode and or anode during operation. In one embodiment, the molecular hydrogen is incorporated into the gap, operably at a predetermined pressure prior to operation and the thermionic generator sealed such that said molecular hydrogen cannot exit the thermionic generator without disassembly. In one embodiment, the molecular hydrogen enters the gap at a certain flow rate and exits at the same flow rate to maintain a constant pressure. In another embodiment, hydrogen is present adjacent to the cathode and/or anode and is allowed to interact with some portion of the cathode and anode but not inter the gap.

In yet another aspect of the invention, a thermionic generator comprises a cathode; an anode positioned some distance from the cathode to create a gap therebetween; and a hydrogen-containing gas species. In one embodiment, the hydrogen-containing gas species is in contact with the cathode and or anode during operation. In one embodiment, the hydrogen-containing gas species is incorporated into the gap, operably at a predetermined pressure prior to operation and the thermionic generator sealed such that said hydrogen-containing gas species cannot exit the thermionic generator without disassembly. Means are included such as valves to control the flow rate and maintaining a selected pressure of the gaseous species in fluid communication with cathode and anode and gap therebetween. For example, the hydrogen-containing gas species enters the gap at a certain flow rate and exits at the same flow rate to maintain a constant pressure. In another embodiment, container means are included so that the hydrogen-containing gas species can be present and in fluid communication with the cathode and/or anode and is allowed to interact with some portion of the cathode and anode but not inter the gap. In another embodiment, the hydrogen-containing gas species results in the termination of the cathode and/or anode surface with hydrogen. In another embodiment, the hydrogen-containing gas species results in the introduction of hydrogen present in the bulk of some portion of the material or materials comprising the cathode and/or anode. In another embodiment, the hydrogen-containing gas species terminates the cathode and/or anode surface with hydrogen through some mechanism and/or incorporates hydrogen into some portion of the material or materials comprising the cathode and/or anode; but does not enter the gap.

Example 1

Polycrystalline nitrogen-incorporated diamond cathodes were deposited on molybdenum substrates using a microwave plasma-enhanced chemical vapor deposition (MP-CVD) reactor at 1.5 kW microwave power in a 50 Torr hydrogen, methane, and nitrogen environment. The thermionic emission current was examined by resistively heating the molybdenum substrate and applying a 0.02V/µm electric field to an anode to collect the thermionically emitted electrons from the heated cathode. A turbomolecular pump was employed that was capable of evacuating the testing chamber to a base pressure of $\sim 1 \times 10^{-7}$ Torr. The pressure was monitored by an ion gauge tube positioned on the pump rather than on the chamber to prevent interference of the gauge's heated filament with the testing of the sample.

The operation of diamond cathodes in hydrogen environments were examined by connecting a tank of ultra-high purity hydrogen to the testing chamber via a leak valve. A residual gas analyzer (RGA) was attached to the testing apparatus for direct measurement of the composition of the gasses fed into the chamber but was not operated during testing.

Two different sets of experiments were conducted to fully characterize how the hydrogen environments influenced the thermionic emission performance from the diamond cathodes. The first set consisted of isothermal testing to allow direct comparison of the emission current in a vacuum environment with that of a low-pressure hydrogen environment. The isobaric testing in the second set of experiments was chosen to assess how operation in a hydrogen environment could improve the stability and temperature ceiling of the diamond cathodes. Both techniques were first performed on a sample in its as-grown state. The sample was then removed from the testing chamber, hydrogenated, and tested a second time in the same manner.

Isothermal experiments consisted of monitoring the thermionic emission current at three temperatures for an extended period of time: 600° C., 625° C., and 650° C. Temperature control was performed by a proportional-integral-derivative (PID) control loop that maintained the temperature within 2° C. of the target set point during testing. At each temperature, the emission current from the sample was initially measured in vacuum ($\sim 1 \times 10^{-7}$ Torr) to establish baseline behavior. Hydrogen was then introduced into the chamber via the leak valve until the pressure at the pump read $\sim 5.5 \times 10^{-6}$ Torr. As mentioned, pressure was measured at the pump to prevent erroneous results. This pressure was maintained for a period of ~1 minute, after which, the valve was closed, and the pressure rapidly decreased back to $1 \times 10^{-7}$ levels. This sequence was performed twice at each temperature.

The testing sequence described above was first performed on an as-grown sample at a temperature of 600° C. followed by two more tests at 625° C. and 650° C., in order of increasing temperature. These three tests represent one testing cycle. Following completion of the third test at 650° C. (and also the first testing cycle), the sample was allowed to cool to room temperature in vacuum and the whole process was executed again two more times, providing data from nine total tests (three testing cycles at each of the three temperatures) for the isothermal experiments. Upon completion of the ninth and final isothermal test, the isobaric experiment was initiated.

Figure 2:
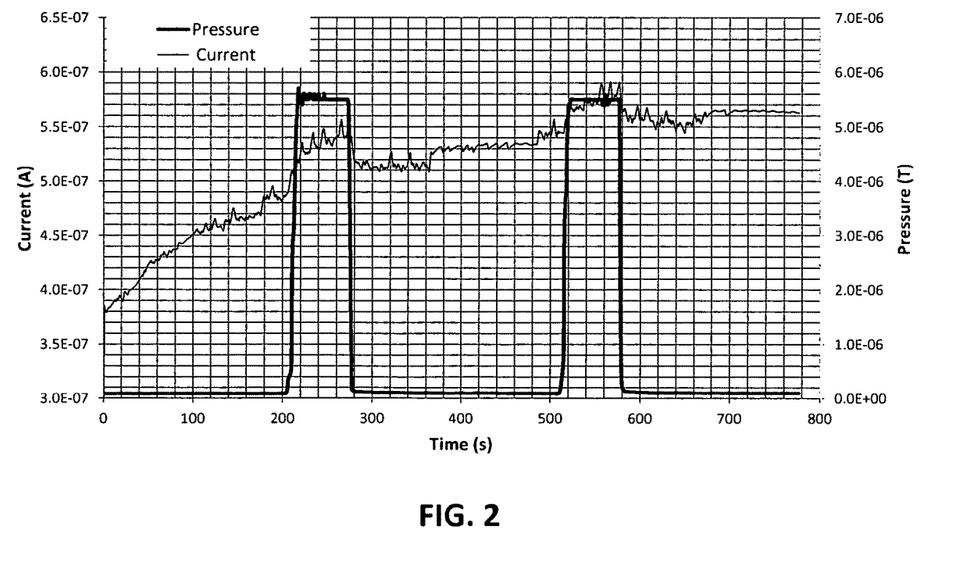
FIG. 2 shows the emission current of a hydrogenated diamond sample plotted against time on the left axis and the pressure of molecular hydrogen plotted against time on the right axis at a constant temperature of 600° C.
Figure 3:
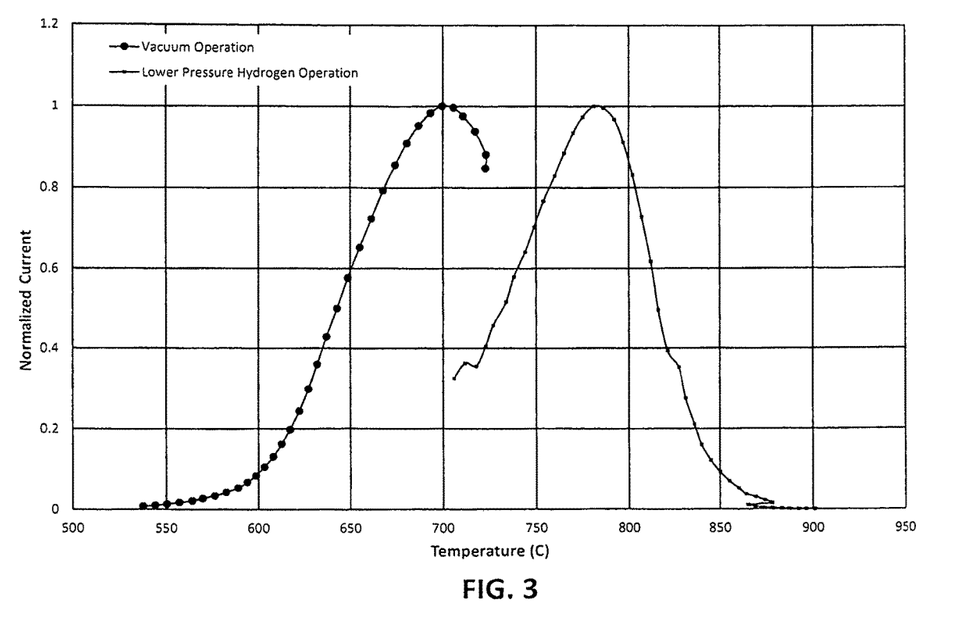
FIG. 3 compares the emission current trend of a diamond sample operating in vacuum over a range of temperatures with that of a sample operating in a molecular hydrogen environment at a pressure of ~5.5×10$^{-6}$ Torr.

Testing for the isobaric experiment entailed observing the emission current versus temperature trend of the diamond cathode in a constant ~5.5×10$^{-6}$ Torr ($N_2$ equivalent) hydrogen environment. Pressure was maintained by using the leak valve in the same manner as previously discussed for the isothermal experiments. The isobaric tests began immediately following the final 650° C. isothermal test without allowing the sample to cool. The temperature control loop was used to increase the temperature in roughly five degree increments up to ~900° C. Each temperature was maintained for 30 seconds and the emission current was constantly monitored. These isobaric tests were intended to determine if the presence of hydrogen would increase the emission current of diamond thermionic emitters and/or raise their operational temperature ceiling. Following this isobaric test, the sample was cooled, re-hydrogenated in the MPCVD chamber by exposing to a low energy hydrogen plasma and both isothermal and isobaric experiments were repeated. Emission current and pressure vs. time for the as-grown sample is shown in FIGS. 2-3. Only the one testing cycle for a hydrogenated sample at 600° C. is presented as all other testing cycles demonstrated similar behavior. Upon inspection, it can immediately be seen that operation in the presence of hydrogen had an enhancing effect on the emission current. As demonstrated in FIGS. 2-3, when hydrogen was fed into the chamber the emission current increased from the baseline and then subsequently decreased back to the baseline when the hydrogen was shut off.

Figure 4:
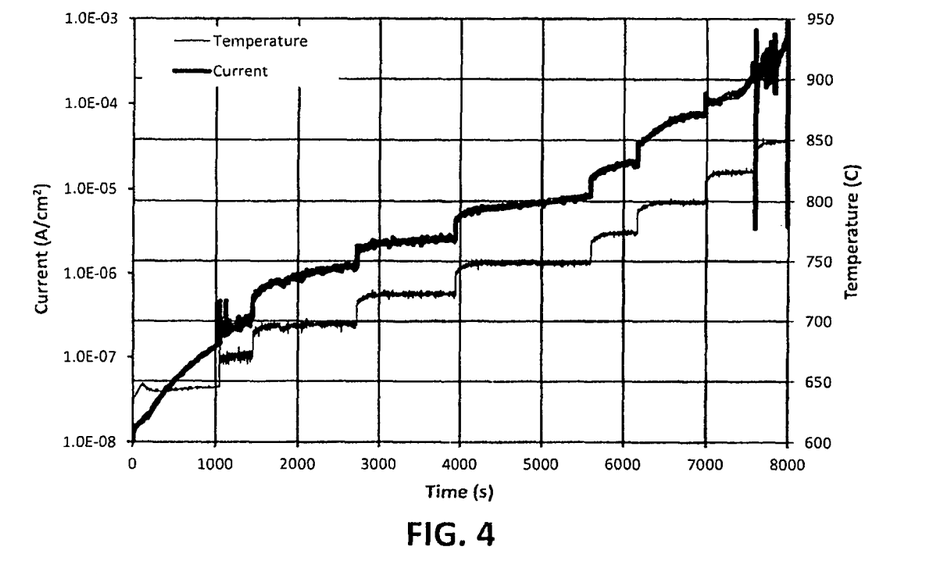
FIG. 4 is a graph showing the increase in emission current from a nitrogen-incorporated diamond sample at increasing pressures.
Figure 5:
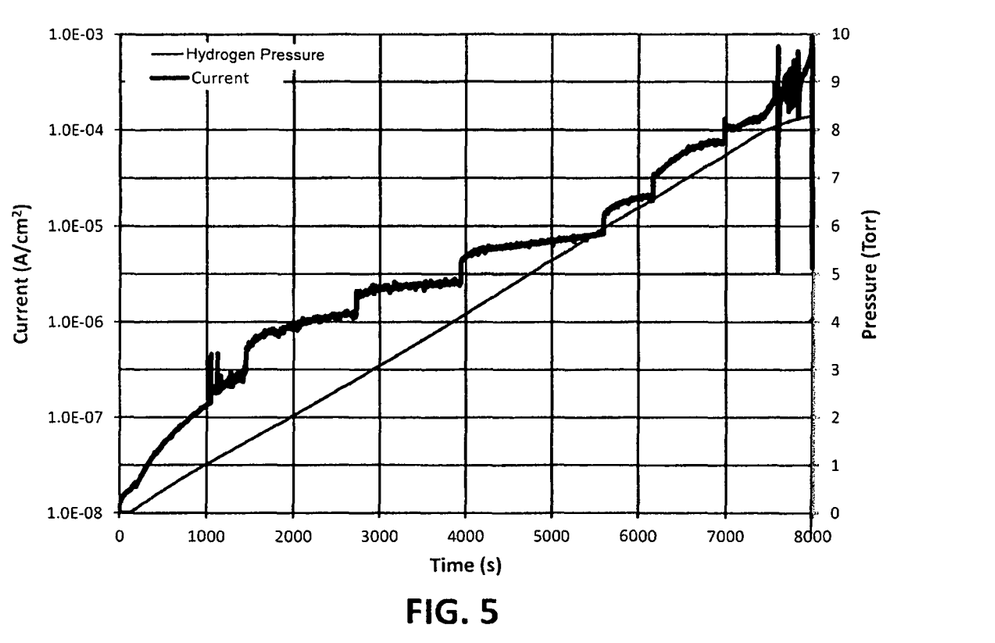
FIG. 5 is a graph showing the increase in emission current from a nitrogen-incorporated diamond sample at increasing pressures.

Results from the isobaric (constant 5.5 μTorr molecular hydrogen environment) are compared against a second sample in vacuum FIGS. 4-5. The data has been normalized such that 1 corresponds to the maximum emission current of each sample to account for any small discrepancies between samples. Both samples demonstrate the typical transition from increasing emission current with increasing temperature as predicted by the Richardson equation to a decreasing trend which is associated with the desorption of performance-enhancing hydrogen. The sample operating in a low pressure molecular hydrogen environment begins this transition at almost 75° C. higher. This indicates that the molecular hydrogen environment is able to either mitigate the desorption of performance-enhancing hydrogen from the diamond cathodes or replenishes the vacant sites with more hydrogen. The effect is in the absence of any external energy source beyond the thermal energy of and electrons emitted from the cathode. It is clear from FIGS. 4-5 that operation at a low pressure molecular hydrogen environment enables operation at higher temperatures.

Example 2

The effect of molecular hydrogen exposure to diamond cathodes during operation was further explored at higher pressures. In this second example, the sample testing chamber was used as in Example 1 but molecular hydrogen was constantly fed into the chamber at a fixed rate and pressure was measured via a capacitance manometer. A diamond sample was grown in the same manner as described in Example 1 annealed and hydrogenated in a low energy hydrogen plasma prior to testing.

Figure 6:
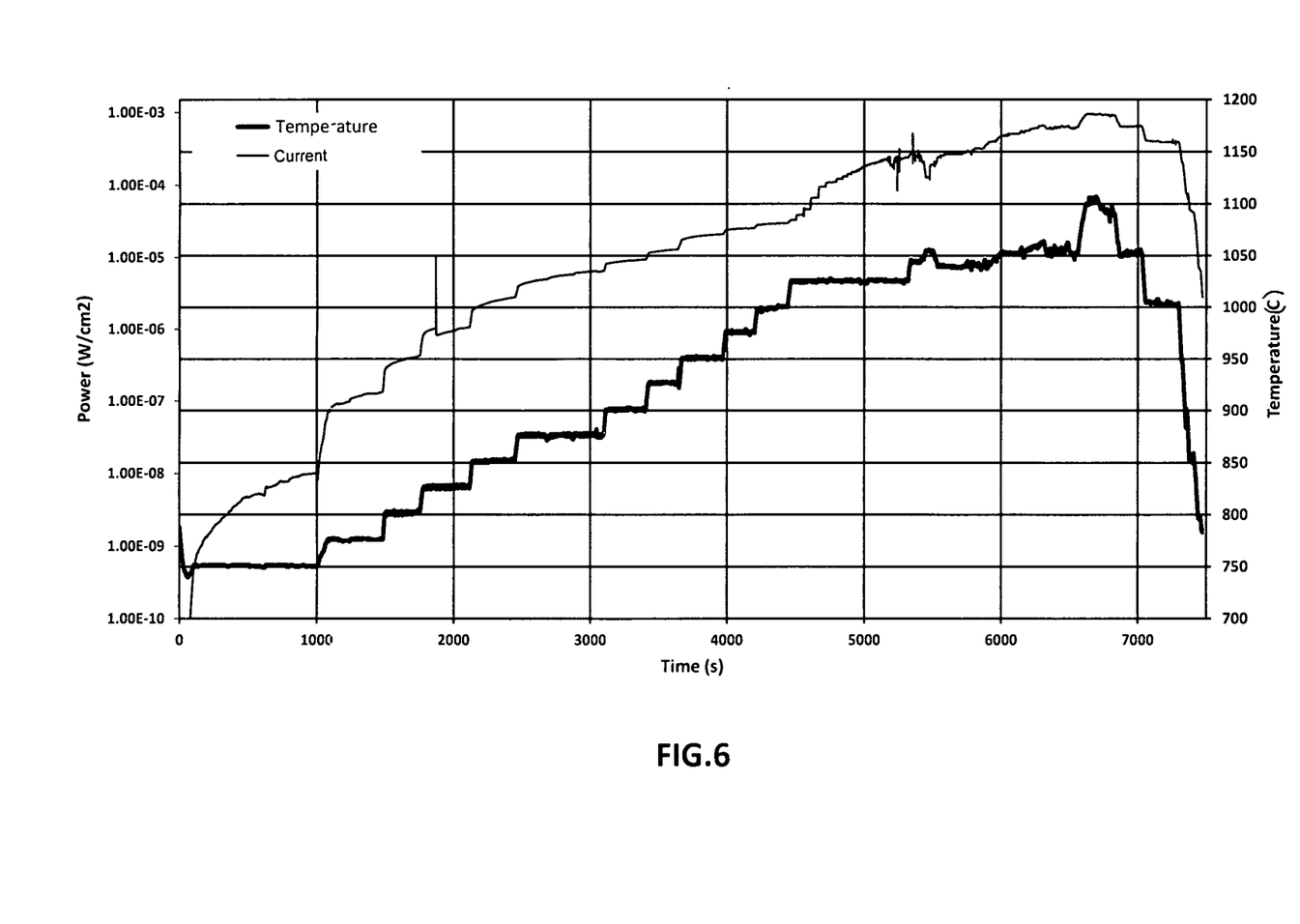
FIG. 6 is a graph showing the power output of an all-diamond thermionic energy converter consisting of a nitrogen-incorporated diamond cathode and identical anode.
Figure 7:
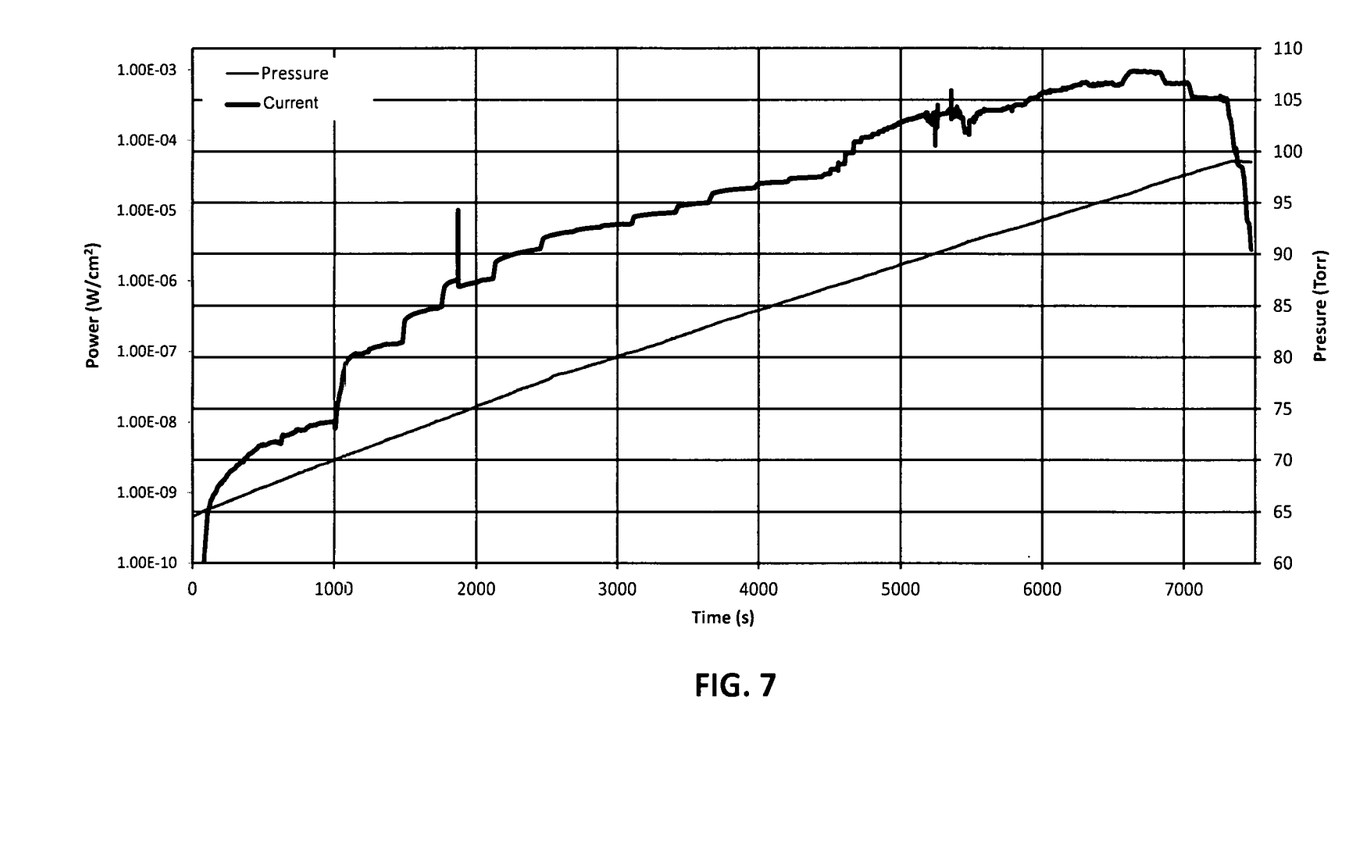
FIG. 7 is a graph showing the power output of an all-diamond thermionic energy converter consisting of a nitrogen-incorporated diamond cathode and identical anode.

The results from this test are seen in FIGS. 6-7 and show that increased molecular hydrogen environment pressure has a further positive effect on the thermionic emission current from diamond films. At each temperature, the emission current demonstrates an increasing trend with increasing temperature. The is a staunch improvement compared to isothermal operation where emission current will predictably decay with time. It can further be seen in FIGS. 6-7 that emission is not only stable but continues to improve at temperatures above 800° C. which is higher than the ~775° C. temperature ceiling found for the isobaric tests described in Experiment 1 and FIGS. 4-5.

The results from this example further confirm that operation of diamond cathodes in molecular hydrogen environments can not only mitigate the performance degradation associated with hydrogen desorption when such cathodes are operated in vacuum but can actually improve performance.

Example 3

The influence of molecular hydrogen environments on the performance of a diamond thermionic generator was also studied. In this example, two identical nitrogen incorporated diamond electrodes were grown in the same manner as described for Example 1. One sample was mounted as a cathode and the other was mounted as an anode. Molecular hydrogen gas was allowed to enter the chamber at a predefined flow rate and the pressure measured via a capacitance manometer. Laser heating was used to heat the cathode as it is non-contact and eliminates any potential electrical interference and/or leakage that may arise from other methods such as a resistive heater. The temperature of the cathode was measured by a non-contact pyrometer. The anode was connected to the cathode through a custom resistor box that allowed the resistance of the circuit (load) to be changed during operation. These resistors were actuated through electromechanical relays. No power supply was used and the circuit was completely isolated, thus the test was a true diamond-based thermionic generator and thermal energy was directly being converted to electrical energy.

Figure 8:
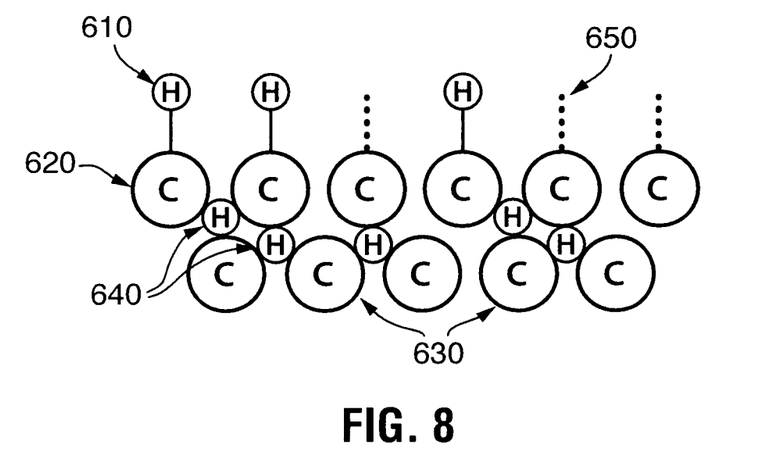
FIG. 8 is pictographic representation of a 2D cross section of a diamond emitter or collector surface demonstrating some degree of surface hydrogen termination and interstitial hydrogen.
Figure 9:
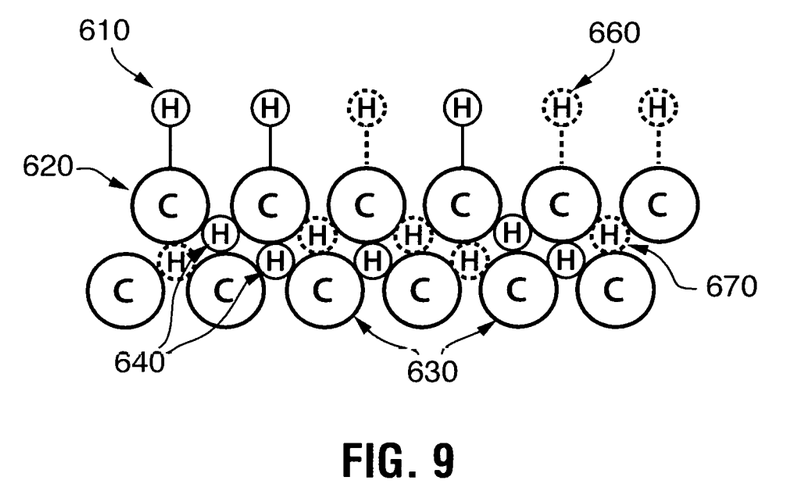
FIG. 9 is a pictographic representation of a 2D cross section of a diamond emitter or collector surface demonstrating higher levels of hydrogen present on the surface and within the surface upon exposure to hydrogen.

From FIGS. 8-9, it can be seen that at each temperature, the total power of the device was increasing with increasing pressure. No decrease in power was observed at any given temperature which is typically observed in vacuum operation. Examples 1 and 2 were meant to show that operation of diamond cathodes in molecular hydrogen mitigates the negative impacts associated with hydrogen desorption during operation. Example 3 extends this observation to an actual thermionic generator, thus confirming that molecular hydrogen environments indeed improve the energy conversion performance. Additionally, the test in FIGS. 8-9 lasted for over two hours, suggesting that the molecular hydrogen also promotes stability during operation.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented herein above. Rather, what is intended to be covered is within the spirit and scope of the appended claims.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

We claim:

1. A thermal energy conversion device comprising:
a microwave plasma-enhanced chemical vapor deposition reactor;
means for producing a selected kW microwave power;
said reactor including at least one anode selected from the group consisting of a nitrogen-incorporated diamond film, a diamond film, a diamond, a polycrystalline nitrogen-incorporated diamond, and combinations thereof deposited on a selected substrate;
said reactor including at least one cathode for electron emission spaced apart a selected distance from the anode to define a gap therebetween
said cathode is selected from the group consisting of a nitrogen-incorporated diamond film, a diamond film, a diamond, a polycrystalline nitrogen-incorporated diamond, and combinations thereof deposited on a selected substrate;
a gaseous species comprising at least molecular hydrogen;
means for heating the cathode in said reactor at a desired temperature;
means for providing a selected pressure within said reactor;
means for monitoring said selected pressure within said reactor;
means for introducing and releasing a selected quantity of the gaseous species to maintain a constant predetermined pressure within said reactor.

2. A thermal energy conversion device comprising:
a reactor;
means for producing power;
said reactor including at least one anode selected from the group consisting of a nitrogen-incorporated diamond film, a diamond film, a diamond, a polycrystalline nitrogen-incorporated diamond, and combinations thereof deposited on a selected substrate;
said reactor including at least one cathode for electron emission spaced apart a selected distance from the anode to define a gap therebetween
said cathode is selected from the group consisting of a nitrogen-incorporated diamond film, a diamond film, a diamond, a polycrystalline nitrogen-incorporated diamond, and combinations thereof deposited on a selected substrate;
a gaseous species comprising at least molecular hydrogen;
means for heating the cathode in said reactor at a desired temperature;
means for providing a selected pressure within said reactor;
means for monitoring said selected pressure within said reactor;
means for introducing and releasing a selected quantity of the gaseous species to maintain a constant predetermined pressure within said reactor.

3. A method of producing energy in a thermal energy conversion device comprising the steps of:
selecting an anode from the group consisting of a nitrogen-incorporated diamond film, a diamond film, a diamond, a polycrystalline nitrogen-incorporated diamond, and combinations thereof deposited on a selected substrate;
selecting a cathode from the group consisting of a nitrogen-incorporated diamond film, a diamond film, a diamond, a polycrystalline nitrogen-incorporated diamond, and combinations thereof deposited on a selected substrate;
selecting a gaseous species comprising molecular hydrogen;
positioning said anode a selected distance from said cathode forming a gap therebetween;
heating the cathode at a desired temperature;
applying a gaseous species to the cathode and into the gap between the cathode and anode forming H bonds and/or C—H bonds on the surface of the cathode;
pressurizing a selected quantity of the gaseous species to a predetermined pressure;
heating and controlling the temperature of the cathode to emit electrons traversing towards the anode producing an thermionic emisison current;
applying an electric field to an anode to collect an emission of thermionically emitted electrons from said heated cathode; and
replenishing said gaseous species used during the conversion process maintaining said predetermined pressure of said gaseous species at said cathode and said gap.

* * * * *